(12) United States Patent
Lee

(10) Patent No.: US 6,515,919 B1
(45) Date of Patent: Feb. 4, 2003

(54) RADIO FREQUENCY POWERED VOLTAGE PUMP FOR PROGRAMMING EEPROM

(75) Inventor: Donny V. Lee, Northport, NY (US)

(73) Assignee: Applied Wireless Identifications Group, Inc., Monsey, NY (US)

( * ) Notice: Subject to any disclaimer, the term of this patent is extended or adjusted under 35 U.S.C. 154(b) by 0 days.

(21) Appl. No.: 09/131,351

(22) Filed: Aug. 10, 1998

(51) Int. Cl.⁷ .............................................. G11C 16/12
(52) U.S. Cl. .................. 365/192; 365/191; 365/228; 365/226; 365/189.06; 365/189.09; 365/185.18; 235/380; 235/492; 340/10.51; 340/10.5; 327/535; 327/536; 327/537; 327/538
(58) Field of Search .................. 365/189.09, 185.18, 365/229, 228, 226, 189.06, 191, 192; 327/535, 536, 537, 538, 540, 541, 530; 235/380, 382, 375, 487, 492; 340/10.5, 10.51

(56) References Cited

U.S. PATENT DOCUMENTS

| | | | | |
|---|---|---|---|---|
| 5,053,774 A | * | 10/1991 | Schuermann et al. | .... 340/10.34 |
| 5,418,751 A | * | 5/1995 | Kaiser | ......................... 365/211 |
| 5,920,472 A | * | 7/1999 | Bijlenga et al. | .............. 363/97 |

* cited by examiner

Primary Examiner—Andrew Q. Tran
(74) Attorney, Agent, or Firm—Salzman & Levy

(57) ABSTRACT

There is provided an RF-powered, RFID transponder operable in either a high frequency or low frequency band. The transponder utilizes an EEPROM which may be programmed. The high voltage required for writing (i.e., programming) the EEPROM is provided by a unique circuit which eliminates the need for voltage multiplying circuits which typically use large, high value capacitors which usually occupy large amounts of chip real estate. It is estimated that the write voltage circuit reduces chip real estate requirements by approximately 13%.

9 Claims, 2 Drawing Sheets

RFID Transponder with Radio Frequency Powered Voltage Pump

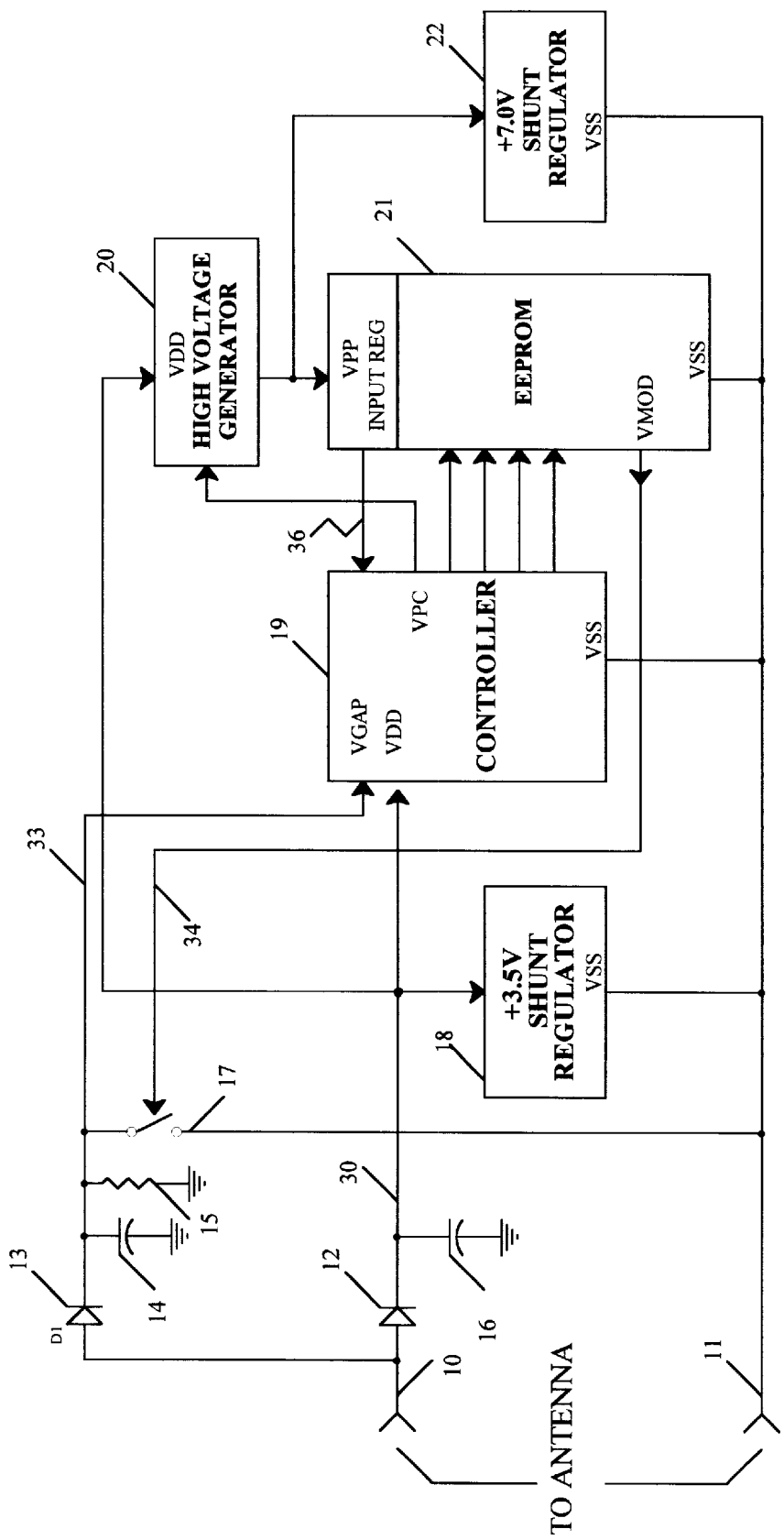
FIG. 1 RFID TRANSPONDER, PRIOR ART

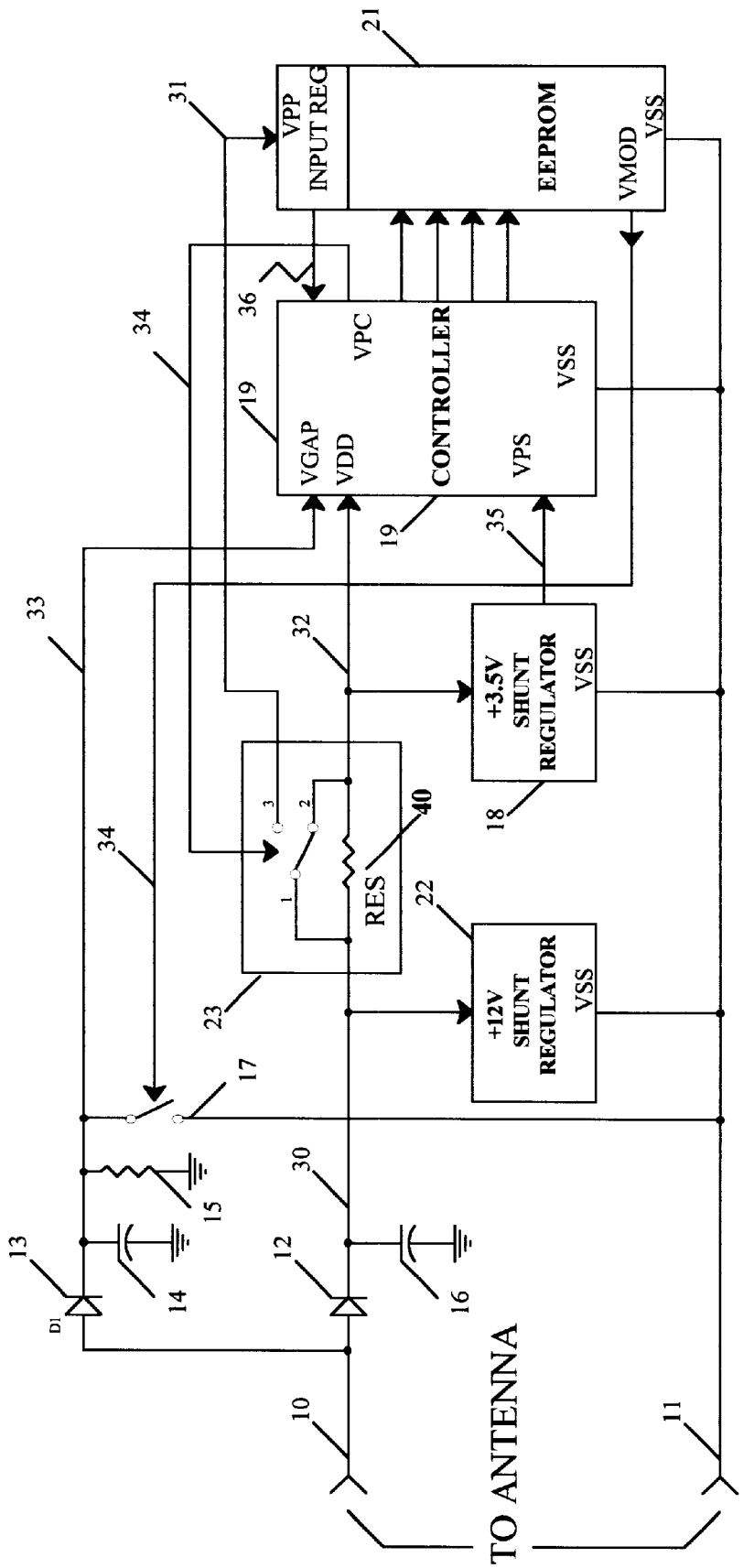
FIG. 2 RFID Transponder with Radio Frequency Powered Voltage Pump

RADIO FREQUENCY POWERED VOLTAGE PUMP FOR PROGRAMMING EEPROM

FEDERALLY SPONSORED RESEARCH OR DEVELOPMENT

Not Applicable

MICROFICHE APPENDIX

Not Applicable

FIELD OF THE INVENTION

The field of this invention is Radio Frequency Indentification (RFID) and, more specifically a compact, RF-powered voltage pump for providing a programming voltage to an EEPROM in an IC-implemented RFID.

SUMMARY OF THE INVENTION

Briefly, this invention employs a simple semiconductor circuit on a radio frequency transponder integrated circuit (IC) to power the logic functions and to generate the required EEPROM programming voltage ($V_{PP}$). $V_{PP}$ is used to force the tunneling of electrons from an "active region" to a floating-gate region of the EEPROM memory cell transistor, that is, to write to the EEPROM. The inventive semiconductor circuit takes advantage of the fact that a close near field coupling can generate voltages far exceeding 10–20 volts. The inventive circuit may therefore provide the necessary programming voltage of 10–17 volts replacing traditional charge pump voltage-multiplier circuits of the prior art. EEPROMs are usually used as part of a miniaturized, self-contained read/write capable radio frequency transponder IC, where the transponder is implemented as a single semiconductor integrated circuit, and on which a high voltage generator is used to deliver the necessary EEPROM programming voltage to enable the transponder's EEPROM read/write functions.

This invention recognizes the fact that a traditional on chip charge pump voltage-multiplier takes up about 15% of an RFID transponder silicon chip's real estate and is typically used less than 1% of the time. In the case of a voltage generator powered by the near field coupling, also called "RF powered voltage generator", the same circuit takes less than 2% of the chip's silicon real estate to perform the same functions. This 13% silicon real estate reduction is accomplished by switching from a charge pump voltage-multiplier to an RF powered voltage pump to generate the EEPROM programming voltages.

BRIEF DESCRIPTION OF THE FIGURES

FIG. 1 is a block diagram of a prior art read/write RFID transponder IC which uses a charge pump voltage-multiplier to generate high voltages for EEPROM write or erase operations.

FIG. 2 is a block diagram of an RFID transponder of the invention that uses a radio frequency powered voltage pump to generate a high voltage to erase and to write the EEPROM.

BACKGROUND OF INVENTION

1. Electrically Erasable and Programmable Read-Only Memory (EEPROM)

Electrically Erasable and Programmable Read-Only Memories (EEPROMs), including Flash EEPROMs, commonly contain an array of memory cells that can be programmed and erased in-circuit. The memory cells are made with semiconductor field effect transistors with floating-gate structures. During programming, the memory cell control gates are selectively charged to store data. To read a memory cell, a sense voltage is applied to the memory cell's control gate and a current/voltage sensing element is applied in series with the drain to source connections. The drain to source current is then sensed by a measuring and decoding circuitry. The voltage required to tunnel the electrons is always higher than that of the supply voltage $V_{DD}$, which must be generated by a charge pump voltage-multiplier. A charge pump voltage-multiplier circuit consists of a clock oscillator to convert DC to AC (a pulse train), and a combination of diodes and capacitors connected in such a way that the DC output voltage is greater than the peak amplitude of the input pulse. This circuit typically requires multiple diodes and many large value capacitors. It is the number of capacitors as well as the value of their capacitance that take up typically 15% of the silicon real estate for an RFID transponder IC.

An important characteristic of memory cell transistors that use "floating-gate" structures, is the voltage threshold called $V_{TH}$, which is the minimum voltage that can be applied to a memory cell gate causing it to "turn-on", and allow current flow between its drain and source. The "threshold voltage" of a memory cell with an uncharged "floating-gate" is generally much lower than the "threshold voltage" of that same memory cell with a charged "floating-gate". This difference forms the basis of EEPROM memory logic-HIGH or logic-LOW decisions.

A developing trend in the industry is to reduce the supply voltage $V_{DD}$ in modern electronic applications. Reducing the supply voltage $V_{DD}$ reduces battery size, battery power and lengthens battery life, enabling the development of smaller and longer lasting devices. Modern microprocessors are presently being developed that use a supply voltage $V_{DD}$ of 3.3V. When programming a low voltage EEPROM or erasing the data, a 12 VDC voltage is applied to the gate electrode causing the electrons to tunnel from the source or drain region of the transistor to the "floating-gate" region. As semiconductor process technologies continue to improve, EEPROM operating voltage or $V_{DD}$ and programming voltages or $V_{PP}$ continue to decrease from $V_{DD}$ of 5V and $V_{PP}$ of 17V, to $V_{DD}$ of 3.3V and $V_{PP}$ of 12V. The threshold voltage $V_{TH}$ of typical EEPROM memory cells in a memory array with uncharged "floating-gate" is not uniform, it typically ranges from about 1.5V to 3.5V ($V_{THL}$). In the same EEPROM memory cells after programming (i.e., containing data), the "floating-gate" will typically have a threshold voltage range from about 5.5V ($V_{THH}$) to 7.0V. The difference between $V_{THL}$ and $V_{THH}$ is the operating margin for an EEPROM. For the sake of constancy, the functional description of this invention will use 3.3V for $V_{DD}$ and 12V for $V_{PP}$. It will be recognized by those familiar with the art, that this invention applies to all cases where $V_{PP}$ is higher than $V_{DD}$.

EEPROMs take advantage of this difference ($V_{THH}-V_{THL}$) in memory cell threshold voltages between uncharged and charged states. During a read operation, a typical EEPROM is provided with a voltage $V_{GS}$ that is greater than the erase threshold voltage range $V_{THL}$ and less than the programmed threshold voltage $V_{THH}$, in other words between 3.5V and 5.5V. This voltage $V_{GS}$ is sufficient to turn-on the memory cells when the "floating-gate" is un-charged and insufficient to turn-on the memory cell with the "floating-gate" is charged. The presence of current flow from drain to source in the memory cell transistor indicates the memory cell is un-charged (erased), the absence of current from drain to source indicates the memory cell is charged (programmed).

2. Radio Frequency Identification (RFID)

RFID is a means of using radio frequency electromagnetic waves to identify objects that are carrying RF identifier transponders. This identification technology is similar to bar code technology, however, instead of using direct line-of-sight light beams, RFID uses non-line-of-sight electromagnetic waves. Each RFID system typically consists of a reader and many transponders. During its normal operation, the reader sends out an interrogating electromagnetic wave to illuminate transponders that came within its zone of interrogation, and the illuminated transponder responds by selectively reflecting the electromagnetic wave as a means to reveal its identity and its memory content.

There are two main categories of RFID transponders; Passive Transponders and Active Transponders. Passive refers to transponders that do not have their own power source and Active refers to transponders that are powered by an on-board power source, such as a battery. Passive transponders are always "beam powered," that is, powered by the electromagnetic beam. Passive RFID transponders usually consist of an external antenna, an RFID chip and an on-board resonating capacitor. This IC (i.e., the RFID chip) can typically store up to several kilobits of data. Some are one-time-programmable (OTP), some are read/write capable with EEPROM or FeRAM (Ferroelectric RAM).

RFID systems can function in dust, dirt, grime, oil, snow, darkness, and high humidity. RFID can also read in non line-of-sight applications, through clothing, paper and non-metallic materials. These features can allow RFID to displace bar-code systems in many commercial and industrial applications. The only disadvantage is the cost of RFIDs. The purpose of this invention is to reduce the complexity and cost of RFID transponder ICs, making them more affordable and available for more applications.

A passive transponder is a transponder that is powered by energy of a radio frequency electromagnetic beam, referred to as beam powered. The reader antenna generates a zone of surveillance or energy field, which is coupled to the antenna on the transponder. The RF energy field picked up by the transponder antenna induces an alternating current that can be rectified by an RF diode and the rectified current can then be used to power the electronic circuits on the transponder. A change in the transponder antenna termination or the antenna's resonance characteristics will change the loading on the transponder antenna. As the loading on the transponder antenna changes, a different amount of RF energy is reflected by the transponder. This change in the "reflected" power from the transponder antenna can be picked up by the reader antenna and thus backscattered. This backscattering is a major means of passive short range radio frequency data communication even through the transponder scatters the energy in a pattern determined solely by the transponder antenna and most of the energy may not be "directed" back to the transmitting antenna.

The present generation of lower frequency (between 100 KHz and 15 MHz) RFID transponders uses antenna resonating circuits to couple or to tap the RF electromagnetic energy from the reader. Depending upon the distance between the reader and the transponder, the coupled voltage can reach voltages in the range of 50 to 100 volts. It is therefore customary for the transponder IC designer to place an over voltage suppressor or a shunt regulator in the form of a Zener diode in the circuit to limit the coupled voltage to 3 to 5 Volts. For the present generation of Read/Write RFID transponder ICs, the rectifier's output voltage is suppressed to approximately 3.5V, and when EEPROM programming is activated, its internal charge pump voltage-multiplier will pump the voltage from 3.5V to the necessary 12 volts for EEPROM programming (i.e., writing). This sequence of suppressing the coupled voltage down to 3.5V and then using a voltage-multiplier to boost it back up to 12 volts is a very inefficient operation. Furthermore, in most typical RFID applications, the transponder is typically "write a few times and read many times". The read to write ratios are typically several thousand times read to one time write. As an example, access control transponders are written once with the employee's name, number and security level. After this write process, for an overwhelming percentage of the operating time, the transponder is in read-only mode. A new write procedure will be activated only when different information, or a change of employee status warrant a new "write". For EAS transponders, the tags are written once with the manufacturer's name, product code, date and routing information. After that is completed, the only time write action is activated is when the merchandise is sold, with transaction record plus a certain bit activated and locked to indicate that the merchandise was sold. Charge pump voltage-multiplier circuits are utilized typically only a small percentage of the time in a typical RFID transponder. If the charge pump voltage-multiplier can be eliminated from the RFID transponder IC, it will reduce chip size by about 13%, and it will increase IC reliability, thus also making the RFID chip more affordable for asset management, EAS and access control applications.

Low power RFID data communication in the 125 KHz or 13.56 MHz is mostly near field communication through back-scattering, which uses magnetic wave communication rather than electric wave communication. RFID Data communication for high frequency band (50 MHz to 5800 MHz) is primarily far field communication through electric field, but still uses the backscatter principle. Applications in contactless smart cards for electronic commerce, hands free identification for access control, asset identification and tracking and electronic article surveillance are all backscattered near field data communications. In a near field communication, the signal strength decrease at the rate that is inversely proportional to $R^3$ (R to the third power), where R is the distance. To state it differently, the signal strength received by the remote transponder will decrease to $\frac{1}{8}$ when the distance from the reader doubles.

Programming an EEPROM requires a higher voltage and higher power to tunnel the electrons from the "active region" to the "floating-gate" region of the memory cell transistor for charge storage. This action now requires 12 volts on a low voltage CMOS EEPROM. In order to generate this voltage, the EEPROM designer has heretofore always turned to the on chip charge pump voltage-multiplier.

DESCRIPTION OF PRIOR ART

FIG. 1 is the block diagram of an existing EEPROM based RFID transponder of the prior art. The signal coupled at the antenna terminals 10 & 11 is detected by rectifier diode 12 and stored in capacitor 16. A separate gap detection diode 13 also detects the coupled signal, but with a much smaller capacitor 14 with shorter time constant controlled by capacitor 14 and resistor 15. Output 33 from the gap detector diode 13 is sent to the controller 19 for signal processing. The switch 17 after the gap detector can provide a short to antenna terminals 10 and 11 under command from the controller 19 and EEPROM 21. When this switch 17 is activated, the antenna is grossly mismatched, causing larger amounts of RF energy to be reflected back to the base station antenna (not shown).

When the controller 19 receives a command through the gap detector diode 13 to program the EEPROM 21, it sends a signal to the high voltage generator 20 to start producing high voltage [, when]. When the high voltage has stabilized, an EEPROM program ready command 36 is sent from the EEPROM interface to controller 19. When the transponder is placed in close proximity to the base station antenna, the diode rectifier 12 will generate a voltage level far exceeding 3.5V, that voltage is regulated by shunt regulator 18, to maintain a 3.5V as the maximum voltage to the logic circuits.

Efficiency of the high voltage generator 20 and the amount of energy required to "erase" or to "write" the EEPROM 21 makes it impossible to have identical read and write distance for any passive RFID transponder. The industry accepted ratio between read and write is 1.0 to 0.5, which means that if the transponder read distance is 1.0 meter, then the write distance for the same identical system will be 0.5 meters.

DETAILED DESCRIPTION OF THE PREFERRED EMBODIMENT

Referring to FIG. 2, there is shown a block diagram of [this] the circuit of the invention. A brief comparison between FIG. 1 and FIG. 2 reveals that the difference between the two diagrams is the absence of the high voltage generator 20 (FIG. 1) in FIG. 2, the addition of a single pole, double throw (SPDT) switch 23, and a different connection for the 12V shunt regulator 22. As shown in FIG. 2, the transponder antenna terminals 10, 11 are connected to a parallel resonate circuit with an inductor and a capacitor (not shown) in the low frequency mode and connected to a simple antenna in the high frequency mode. The alternating current induced in the antenna is rectified by the rectifier diode 12. The design shown in FIG. 2 is a half wave rectifier, for people familiar with the art. However, the invention is not considered limited to the half wave rectifier chosen for purposes of disclosure. Other implementations such as a full-wave rectifier or voltage doubler can also be used. For best performance, Schottky diodes and more specifically, zero-bias Schottky diodes have been found to provide the best performance in the high frequency bands. There are still other forms of detecting circuits, such as low threshold field effect transistors which may also be used as input power rectifiers.

Depending on the frequency of operation, backscatter can be implemented through different circuit principles. For operation below 30 MHz, the transponder antenna input can be viewed as a LC (inductor and capacitor) resonant circuit. For high frequency operation, the antenna [is] may be viewed as an antenna with a proper voltage standing wave ratio (VSWR), to consider matching and mismatching conditions. In order to perform backscattering, the transponder must change its resonant frequency (in the case of low frequency operation) or change its terminating impedance (in the case of high frequency operation) to change the reflectivity of the transponder. This change in reflectivity results in different degrees of absorption of the illuminating RF energy, thereby causing different amounts of reflection of the illuminating carrier (i.e., the RF energy). As the reflectivity is modulated by the data stored in the EEPROM, the base station antenna recovers this changing carrier strength and decodes it into a data stream.

One of the methods for changing the antenna's terminating impedance or changing the antenna resonance is shown in FIG. 2. The single pole, single throw (SPST) switch 17 is connected to the gap detecting diode 13. When switch 17 is in the open position, the gap detector 13 can function normally as a signal detector with a pre-determined time constant, When switch 17 closes, it provides an instantaneous short circuit during the positive half cycle of the carrier signal. This immediately changes the terminating impedance of or the resonance of the antenna, making it highly reflective. Other implementations are also possible and the invention is not considered to be limited to the SPST switch configuration shown for purposes of disclosure. As an example, switch 17 can be connected directly to the antenna terminals 10, 11. However, this approach is feasible only in the low frequency band. When used in the high frequency band, the internal stray capacitance of switch 17 will render the circuit ineffective.

Output from rectifier 12 is applied directly to the series $V_{PP}$ regulator 23. The function of the series $V_{PP}$ regulator 23 is to: a) provide a direct by-pass for the rectified voltage when the transponder is in read-only mode; and b) act; as a series regulator to isolate the $V_{PP}$ and $V_{DD}$ voltages when in EEPROM programming mode. For those familiar with the art, regulator 23 described in this section is a passive regulator. Regulator 23 can also be implemented with active semiconductor elements consisting of pass transistors, a voltage reference and an error amplifier.

During read-only operation, the voltage coupled onto the rectifier 12 need only be sufficient to power the logic circuits in the transponder, resulting in a longer operating distance in read mode than in write mode. That is, when series $V_{PP}$ regulator 23 provides direct connection between points 30 and 32. As the transponder moves closer to the base station antenna, the rectifier output starts to increase above 3.5V. At this point, the 3.5V shunt regulator 18 starts a clamping action that keeps the rectifier output voltage at approximately 3.5V. Shunt regulator 18 is also designed with a current sensing means to measure the amount of by-pass current, as an indirect measurement of the equivalent rectifier 12 output voltage assuming there is no voltage clamping (i.e., an unclamped voltage). When the clamping current indicates that the rectifier's unclamped output voltage is over 12 volts, the shunt regulator 18 sends a ready to program (RTP) signal 35 to the controller 19 to indicate there is sufficient coupled power to support EEPROM programming. In other words, the RPT program the EEPROM.

When the reader (not shown) sends a programming command to the transponder through the gap detector diode 13, and controller 19 checks and verifies that RTP signal 35 is present, controller 19 then issues a switching command to the switch within the serial $V_{PP}$ regulator 23, thereby activating the switch and connecting the output of the voltage rectifier 12 to the input terminal 31 of EEPROM 21. At this time, RTP signal 35 will be lost (i.e., become inactive), due to the insertion into the circuit of resister RES 40 between the power supply line between points 30 and 32, and the full level of the voltage developed by the rectifier 12 is used to supply a 12 VDC voltage to EEPROM 21. The EEPROM 21 input interface circuit must also provide a voltage-sensing function to ensure that the voltage at input terminal 31 is at a sufficient level to ensure error free programming.

If the voltage at the output of the rectifier 12 is higher than 12 VDC, the safe operating voltage for the EEPROM 21, the 12 volt shunt regulator 22 will activate and maintain the rectifier voltage at approximately 12V. Although the EEPROM 21 needs a high voltage for erase and write functions, the supply voltage to controller 19 must remain near 3.5V. This voltage is derived through the combined action of the series $V_{PP}$ regulator 23 and shunt regulator 18. When the switch in the series $V_{PP}$ regulator 23 is in the active position (i.e., connecting points 30 and 31), the off-resistance between 30 and 32, the resistance value of RES 40 is designed to provide a sufficient voltage drop to maintain overall system effectiveness and power efficiency. If the controller 19 and its associated circuits consume 10 $\mu$A at 3.5V, and the input of the series $V_{PP}$ regulator 23 is set at 12V, the resistance will be slightly lower than: (12v–3.5v/10 $\mu$A) or 850K Ohms. As a design parameter, RES 40 should be 800K Ohms. This value will provide sufficient drop through RES 40 to drop 8.2 volts at approximately 10 $\mu$A, thereby supplying approximately 3.8V to the regulator and allowing the shunt regulator 18 sufficient margin to activate and maintain a steady 3.5V. After the programming function is completed, $V_{PC}$ 36 goes low and series $V_{PP}$ regulator 23 reverts to the bypass mode for receive operation, and the transponder resumes read-only operation. Again, for those familiar with the art, these functions provided by shunt regulator 22, series regulator 23 and shunt regulator 18 can be implemented with either passive implementations or active implementations.

Since other modifications and changes varied to fit particular operating conditions and environments or designs will be apparent to those skilled in the art, the invention is not considered limited to the examples chosen for purposes of disclosure, and covers changes and modifications that do not constitute departures from the true scope of this invention.

Having thus described the invention, what is desired to be protected by Letters Patent is presented in the subsequently appended claims.

What is claimed is:

1. An RFID transponder, comprising:
   a) an EEPROM having a write operating mode and a read-only operating mode, said EEPROM being adapted to receive data during said write operating mode, to store said received data, and to present said stored data during said read-only operating mode;
   b) a controller operatively connected to said EEPROM for selecting between said read-only and said write operating modes;
   c) a power supply operatively connected to said EEPROM and said controller, said power supply being adapted to receive power from an incident RF signal and to selectively provide at least two different DC voltages therefrom: a first voltage being associated with said read-only operating mode and having a first magnitude controlled by a first shunt regulator, and a second voltage being associated with said write operating mode and having a second magnitude sufficient to write said EEPROM, said second magnitude being controlled by a second shunt regulator, said power supply further comprising series regulating means operative when said second voltage is selected to provide a supply voltage to said controller.

2. The RFID transponder as recited in claim 1 wherein said first shunt regulator comprises means for generating a request to program signal when said second voltage is selected.

3. The RFID transponder as recited in claim 1 wherein said second voltage is generated by means being void of voltage multiplying means.

4. The RFID transponder as recited in claim 1 wherein said first voltage is a supply voltage appropriate for operating said EEPROM and said controller in a read-only mode and said second voltage is appropriate for writing said EEPROM.

5. The RFID transponder as recited in claim 4 wherein said first voltage is approximately 3.5 volts DC and said second voltage is approximately 12 volts DC.

6. The RFID transponder as recited in claim 1 wherein said selection between said first voltage and said second voltage is accomplished by a switch.

7. The RFID transponder as recited in claim 6 wherein said switch is a single pole, double throw switch.

8. The RFID transponder as recited in claim 7 wherein said switch is activated by said controller.

9. The RFID transponder as recited in claim 7 wherein a first position of said switch selects said read-only operating mode and a second position of said switch selects said write operating mode of said EEPROM.

* * * * *